United States Patent

Cohen

[11] 4,097,829
[45] Jun. 27, 1978

[54] THERMOELECTRIC COMPENSATION FOR VOLTAGE CONTROL DEVICES

[75] Inventor: Leonard D. Cohen, Brooklyn, N.Y.

[73] Assignee: Cutler-Hammer, Inc., Milwaukee, Wis.

[21] Appl. No.: 768,480

[22] Filed: Feb. 14, 1977

[51] Int. Cl.² .................................................. H03J 3/04
[52] U.S. Cl. ................................... 334/15; 331/107 G; 331/176; 331/177 V; 357/14; 357/15; 357/28
[58] Field of Search .......................... 331/16, 70, 176; 357/14, 15, 28; 334/15

[56] References Cited

U.S. PATENT DOCUMENTS

| 3,023,347 | 2/1962 | Strull | 357/28 X |
|---|---|---|---|
| 3,286,138 | 11/1966 | Shockley | 357/28 |
| 3,397,370 | 8/1968 | Bief et al. | 357/28 X |
| 3,935,585 | 1/1976 | Korovin et al. | 357/14 |

OTHER PUBLICATIONS

Bosch, *A Thermal Oscillator Using the Thermo-Electric (Seebeck) Effect In Silicon*, Solid State Electronics, Sep. 22, 1972, vol. 15, pp. 849-852.

*Primary Examiner*—Paul L. Gensler
*Attorney, Agent, or Firm*—Kevin Redmond

[57] ABSTRACT

A tuning compensation device to reduce post-tuning frequency drift in voltage controlled oscillators, comprising a thermoelectric element, such as a wafer of doped semiconductor material, in contact with the junction of a tuning element, such as a varactor diode, to produce a correction to the control voltage and thereby compensate for thermally induced frequency drift.

9 Claims, 4 Drawing Figures

THERMOELECTRIC COMPENSATION FOR VOLTAGE CONTROL DEVICES

BACKGROUND

1. Field

The present invention relates to improvements in the reduction of post-tuning frequency drift in voltage controlled oscillators, and, in particular, to the compensation of post-tuning drift caused by thermal changes within the varactor tuning element.

2. Prior Art

The time required for an oscillator to become stable at a particular frequency is referred to herein as settling time. Presently available voltage controlled oscillators are unsatisfactory in a number of special applications where an extremely short settling time in the order of microseconds is required. Various prior art approaches have either been unable to provide the desired settling time or have proven to be complicated and costly.

The primary source of settling time is the tuning element, usually a varactor diode. The capacitance of a varactor diode is a function of the back-bias voltage applied to it. FIG. 1 is a graph of the capacitance of a typical varactor diode as a function of the back-bias voltage. In this FIGURE, the ordinate 1 represents the diode capacitance, the abscissa 2 represents the magnitude of the back-bias voltage, a curve 7 represents the diode capacitance at a junction temperature $T_2$, a second curve 8 represents the diode capacitance at a second temperature $T_1$, a point 3 represents a back-bias voltage that corresponds to a value of capacitance 6 on curve 8 and also to a value of capacitance 5 on curve 7. A point 12 represents the back-bias voltage corresponding to a capacitance 15 on curve 8, and a point 4 represents the back-bias voltage corresponding to the value of capacitance 6 on curve 7.

In the usual operation of a voltage controlled oscillator, a back-bias voltage, such as the back-bias voltage 3, is applied to the varactor diode to set the oscillator at a desired frequency $F_2$. When the back-bias voltage 3 is applied, the varactor exhibits a capacitance 6, which sets the oscillator to the frequency $F_2$. If the oscillator was previously operating at a different frequency $F_1$, which required a varactor diode back-bias voltage 12 and a corresponding capacitance 15, the varactor diode junction would be at a temperature $T_1$, determined by the varactor dissipation at the frequency $F_1$. The application of the back-bias voltage 3 will first cause the varactor diode to exhibit a capacitance 6, because the varactor diode junction initially remains at temperature $T_1$. However, the varactor diode dissipation will be different from that at $F_1$, causing the junction temperature to shift over a period of time to temperature $T_2$.

When the diode reaches temperature $T_2$, the back-bias voltage 3 will no longer correspond to the capacitance 6. The diode characteristic will have shifted from curve 8 to curve 7 because of the change in junction temperature. The diode will now exhibit a capacitance 5, which shifts the oscillator frequency away from $F_2$. To return the oscillator to frequency $F_2$, the varactor diode must be readjusted to exhibit the capacitance 6. To accomplish this, a new value of back-bias voltage 4 is required. This voltage can be applied by adding to back-bias voltage 3 a control correction voltage represented by the difference between points 3 and 4.

In prior art circuitry, the correction voltage was usually generated by means of a feedback circuit. However, where short settling times and uncomplicated, compact circuitry is desired the feedback circuit approach has generally proven unsatisfactory. Such prior art circuits usually compare the frequency of the oscillator with a frequency standard to determine the frequency error. An error correcting voltage is generated from this comparison and is applied as a correction signal to the varactor diode control circuit. Unfortunately, the electrical inertia of such feedback circuits is usually too large to achieve the desired frequency correction in a few microseconds.

The principal cause of post tuning frequency drift is the difference in heat dissipation occurring in the varactor diode at different frequencies. The reason for this difference can be understood by considering the equivalent circuit of a varactor diode shown in FIG. 2. This circuit comprises terminals 13 and 14, a series resistance 9, a voltage controlled variable capacitance 11, and a parallel resistance 10.

The capacitance 11 represents the depletion layer capacitance at the varactor diode junction. In practical applications, the value of capacitance 11 is reduced by increasing the back-bias voltage which causes the diode depletion layer to widen. The widening of the depletion layer causes the depletion layer to encompass a greater portion of the lossy bulk material represented by series resistance 9. The portion of the series resistance 9 encompassed by the depletion layer is virtually removed as a loss element, because it is bypassed by the depletion layer capacitance. The resistance 9 is a principal source of loss in a varactor, and its reduction with increasing depletion layer width results in a measurable reduction in dissipation. Consequently, a different back-bias voltage applied to tune a voltage controlled oscillator to a different frequency causes a change in the varactor diode dissipation, junction temperature, and capacitance characteristic.

SUMMARY

It is an object of the present invention to provide a thermally compensated tuning element suitable for voltage controlled oscillator applications requiring a settling time in the order of a few microseconds.

It is another object of this invention to provide a thermally compensated tuning element that is compact and compatible with integrated circuits.

It is a further object of this invention to provide a miniature, thermally compensated tuning element that is completely self contained.

In the present invention, these objectives are achieved by placing a Seebeck wafer with appropriate doping in direct contact with a varactor diode tuning element to directly produce and apply a correction voltage which compensates the varactor diode for the detuning effects of different dissipations at different operating frequencies.

DETAILED DESCRIPTION OF THE INVENTION

Figure 3:
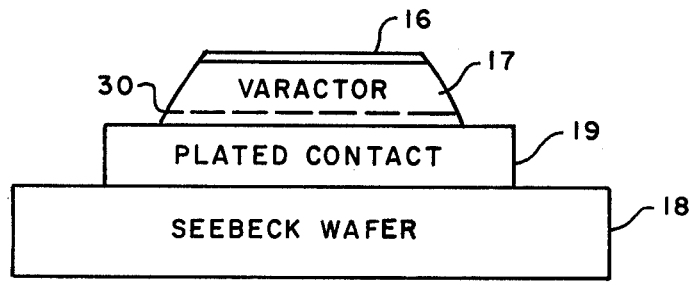
FIG. 3 is a cross sectional view of a varactor diode, and a compensating Seebeck wafer.

In FIG. 3, a Seebeck wafer 18 makes contact with a plated electrode 19 on a Schottky barrier varactor diode 17, which has the junction 30 positioned beneath the diode as shown. The diode is inverted from its usual position in that the junction side is faced downward to place the junction electrode in contact with the Seebeck wafer. Electrical contact to the varactor is made by way of electrode 16, located atop the diode.

In the present invention, the heat generated in the varactor diode junction passes to the wafer to produce a voltage change that acts to correct the control voltage applied to the varactor, thereby compensating for the change in varactor capacitance characteristic with the change in temperature. Although the present invention can be used with P-N varactor diodes, the arrangement shown in FIG. 3 is particularly advantageous as the heat produced at the junction of a Schottky device is conducted by means of a metal contact and electrode directly to the Seebeck wafer, permitting the Seebeck wafer to quickly follow junction temperature changes.

In a Seebeck wafer, when heat is applied to the surface adjacent to the varactor diode junction, carriers in the wafer diffuse from the region at the interface with the varactor diode junction to the opposite side of the wafer. This results in a voltage referred to as the thermoelectric or Seebeck voltage, appearing across the wafer, the polarity of which is dependent upon the doping. If the wafer is of N-type material, the polarity will be positive at the varactor diode interface. The reverse polarity is produced with P-type material.

Figure 1:
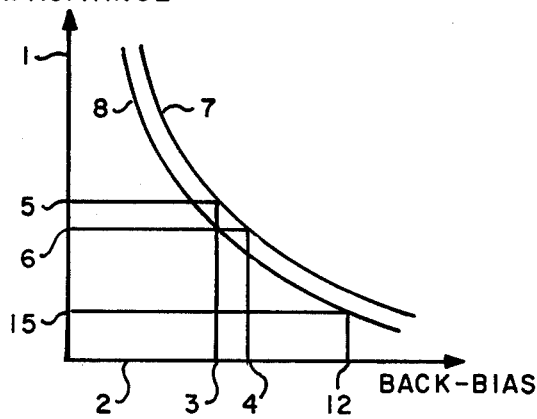
FIG. 1 is a graph of the capacitance characteristic of a varactor diode, as a function of back-bias voltage and diode temperature.

Since the wafer and the varactor diode are connected in series, the voltage appearing across the wafer is in series with the control voltage applied to the varactor diode. This voltage is, in effect, a feedback voltage controlled by the junction temperature, which acts to oppose thermally induced changes in the varactor diode capacitance characteristic, such as occur in voltage controlled oscillators whenever the frequency is changed. As described above in connection with the varactor characteristics shown in FIG. 1, the correction voltage to maintain a capacitance 6, after a shift in characteristic from curve 8 to 7, is the voltage difference between points 3 and 4. This voltage is supplied in the present invention by the Seebeck wafer.

The arrangement as shown in FIG. 3 has a fast response time because the compensation device is an integral part of the varactor diode assembly itself and the combination has very low electrical inertia. The incremental change in the Seebeck voltage with temperature can be made, by appropriate doping, to be of sufficient magnitude to reduce post-tuning frequency drift and settling time caused by thermal effects.

The thermoelectric or Seebeck effect occurs in many semiconductors and is described in the *Properties, Physics and Design of Semiconductor Devices* by John N. Shive, the Van Nostrand Company, 1959. The magnitude of the effect varies with semiconductor material type and resistivity. This is described in *Physics of Semiconductor Devices* by S. Sze, John Wiley Co., 1969. For example, the change in thermoelectric voltage with a change in temperature of P-type silicon material with 0.1 ohm-centimeter resistivity is 1 millivolt per degree centigrade. Similar values can be obtained for N-type silicon, except that the polarity is reversed.

For a voltage controlled oscillator with a midrange tuning sensitivity of 100 MHz per volt, the required compensation is typically 100 KHz per degree centigrade. This compensation can be provided by a Seebeck wafer with 1 mv per degree centigrade material. The amount of compensation will vary with the sensitivity of the voltage controlled oscillator and, therefore, the specific value of the thermoelectric compensation for best performance over the tuning range can be determined from the frequency-versus-voltage characteristic curve of the oscillator.

Figure 4:
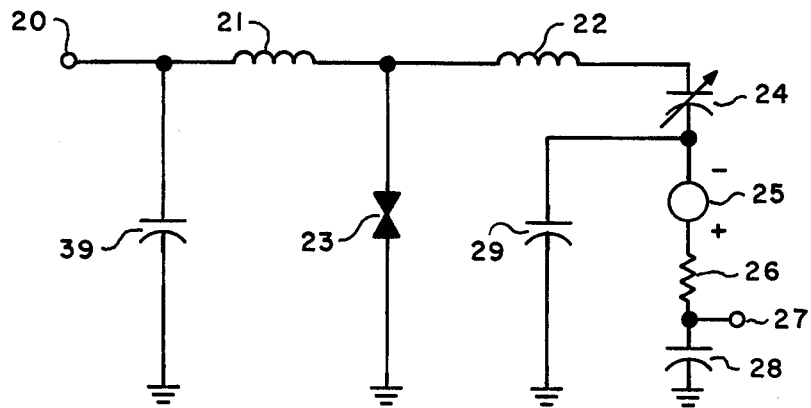
FIG. 4 is a schematic diagram of a typical circuit incorporating the compensating Seebeck wafer shown in FIG. 3.

An application of the present invention is shown in voltage controlled Gunn diode circuit of FIG. 4. In this circuit, a Gunn effect diode oscillator 23 receives bias voltage from terminal 20 through an RF filter consisting of choke 21 and capacitor 39. The tuning circuit for the Gunn diode comprises a series inductor 22 and a varactor diode 24. The varactor diode tuning element comprises a Seebeck semiconductor compensator symbolized by an equivalent voltage generator 25 and a series resistance 26. The Seebeck wafer is isolated from the RF circuitry by bypass capacitors 28 and 29. Varactor diode back-bias voltage is supplied to terminal 27 and is applied to the varactor diode through the Seebeck wafer 25.

When the proper voltage is applied to port 20, the Gunn diode will oscillate in accordance with the frequency determined by the tuning circuit. The value of the capacitance of the tuning circuit is varied by the varactor diode back-bias voltage applied to port 27. No loss occurs in the Seebeck wafer at RF frequencies because of the bypassing provided by capacitor 29. The Seebeck wafer appears only as a resistance and a dc voltage source in the dc bias circuit, and since the varactor diode draws little dc current, the loss to the bias circuit is small.

Figure 2:
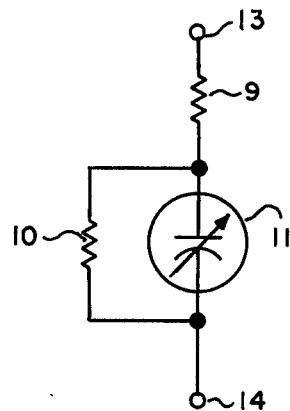
FIG. 2 is a schematic diagram of the equivalent circuit of a varactor diode.

In the operation of the circuit shown in FIG. 2, the varactor diode junction becomes heated, causing the varactor characteristics to shift. The temperature change causes the Seebeck wafer to generate a bias voltage in equivalent generator 26, which adds to the bias voltage supplied to terminal 27 to counteract the thermally induced detuning effect in the manner described above.

I claim:

1. A device for compensating a thermally produced shift in the tuning characteristic of voltage controlled frequency tuning elements comprising:
   (a) a Seebeck effect device with a voltage-temperature characteristic to produce a control correction voltage with a magnitude substantially equal to the thermally induced control voltage shift of the tuning element,
   (b) means for thermally connecting said Seebeck device to said tuning element to cause the Seebeck device to experience substantially the same temperature change as the tuning element, and
   (c) means for electrically connecting said Seebeck device to the control voltage circuit of said tuning element in voltage opposition to the thermally induced control voltage shift to cancel the effect of said thermally induced shift in the tuning characteristic of the tuning element.

2. A device as claimed in claim 1, wherein said thermal connection means is provided by direct contact of the Seebeck device to the tuning element.

3. A device as claimed in claim 1, wherein said means for electrical connection is by direct connection of the Seebeck device to the tuning element.

4. A device as claimed in claim 3, wherein said Seebeck device is a wafer of semiconductor material doped to produce said control correction voltage.

5. A device as claimed in claim 4, wherein said tuning element is a Schottky barrier varactor diode.

6. A device as claimed in claim 5, wherein the junction side of said varactor diode is placed in contact with said Seebeck device.

7. A device as claimed in claim 5, wherein said Schottky barrier device is inverted to place the junction electrode beneath the varactor with the junction side in direct contact with the Seebeck device and wherein said Seebeck device physically supports said varactor diode.

8. A device as claimed in claim 7, wherein said Schottky barrier device is composed of N-type material and said Seebeck device is composed of P-type material.

9. A device as claimed in claim 4, wherein said tuning element is a P-N junction varactor diode.

* * * * *